(12) United States Patent
Chen et al.

(10) Patent No.: US 6,468,904 B1
(45) Date of Patent: Oct. 22, 2002

(54) RPO PROCESS FOR SELECTIVE COSI$_x$ FORMATION

(75) Inventors: Dian-Hau Chen, Hsin-Chu (TW); Fu-Mei Chiu, Miao-Li (TW); Lin-June Wu, Shin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/883,162

(22) Filed: Jun. 18, 2001

(51) Int. Cl.[7] .................. H01L 21/44; H01L 21/302
(52) U.S. Cl. .................. 438/682; 438/597; 438/683; 438/704; 438/706; 438/717; 438/738; 438/745; 438/756
(58) Field of Search ................ 438/704, 586, 438/706, 587, 710, 597, 714, 682, 717, 683, 721, 756, 723, 724, 735, 737, 738, 740, 743, 744, 745, 751

(56) References Cited

U.S. PATENT DOCUMENTS

| | | | |
|---|---|---|---|
| 5,863,820 A | 1/1999 | Huang | 438/241 |
| 5,998,252 A | 12/1999 | Huang | 438/241 |
| 6,004,843 A | 12/1999 | Huang | 438/241 |
| 6,010,948 A * | 1/2000 | Yu et al. | |
| 6,015,730 A | 1/2000 | Wang et al. | 438/241 |
| 6,046,103 A | 4/2000 | Thei et al. | 438/624 |
| 6,200,848 B1 * | 3/2001 | Lin et al. | |

* cited by examiner

Primary Examiner—Ha Tran Nguyen
(74) Attorney, Agent, or Firm—George O. Saile; Stephen B. Ackerman; Rosemary L. S. Pike

(57) ABSTRACT

A method for forming an improved RPO layer by using a composite layer and a two-step etching process in a salicide process in the fabrication of integrated circuits is described. Isolation areas are formed on a semiconductor substrate surrounding and electrically isolating device areas wherein at least one device area is to be silicided and wherein at least one device area is not to be silicided. A composite resist protective oxide layer is formed overlying device areas comprising a first layer of oxide and a second layer of silicon oxynitride. The silicon oxynitride layer is dry etched away overlying the device area to be silicided. Thereafter, the oxide layer is wet etched away overlying the device area to be silicided. Silicidation is performed to complete fabrication of the integrated circuit device.

23 Claims, 3 Drawing Sheets

RPO PROCESS FOR SELECTIVE COSI$_X$ FORMATION

BACKGROUND OF THE INVENTION (1) Field of the Invention

The present invention relates to the fabrication of integrated circuit devices, and more particularly, to a method of improving the resist protective oxide (RPO) layer to improve salicide processes in the fabrication of integrated circuits.

(2) Description of the Prior Art

In the fabrication of integrated circuit devices, silicidation processes are often used in order to obtain higher circuit performance. In silicidation, a refractory metal layer is deposited and then annealed. The underlying silicon reacts with the refractory metal layer to produce a silicide overlying the gate electrode and source and drain regions. The silicided gate and source/drain regions have lower resistance than non-silicided regions, especially in smaller geometries, and hence, higher circuit performance.

It may be desired to perform silicidation on one part of a wafer while protecting another portion of the wafer from silicidation. A resist protective oxide (RPO) layer is deposited over semiconductor device structures and then selectively removed where silicidation is desired. The RPO layer will prevent silicidation where it remains over the semiconductor device structures.

Wet or dry etch processes can be used to selectively remove the RPO layer. In the wet etch process, typically dipping in dilute hydrofluoric acid (DHF), long DHF dipping time will cause the recessing of the underlying gate electrode spacer liner layer and also shallow trench isolation (STI) oxide loss. Spacer recessing can cause active area shorting and yield loss due to metal residue being inserted under the spacer. STI loss is one of the major concerns causing a "double hump" in the I-V curve and leakage. In the dry etch process, high substrate loss and active area damage are observed. These will cause shallow junction damage or poor salicide, formation. It is desired to find a new film scheme and etch process to improve the RPO process window.

U.S. Pat. No. 5,998,252 to Huang, U.S. Pat. No. 6,015,730 to Wang et al, U.S. Pat. No. 5,863,820 to Huang, and U.S. Pat. No. 6,004,843 to Huang discuss salicide processes using a conventional RPO layer. U.S. Pat. No. 6,046,103 to Thei et al discloses a salicide process. RPO is not disclosed.

SUMMARY OF THE INVENTION

Accordingly, it is a primary object of the present invention to provide an effective and very manufacturable method for improving junction leakage performance in a salicide process in the fabrication of integrated circuits.

It is a further object of the invention to provide a process for forming an improved RPO layer in a salicide process in the fabrication of integrated circuits.

Yet another object is to form a composite RPO film and a two-step etching process to improve junction leakage performance in a salicide process.

A still further object of the invention to provide a process for forming an improved RPO layer by using a composite layer and a two-step etching process in a salicide process in the fabrication of integrated circuits.

In accordance with the objects of the invention, a method for forming an improved RPO layer by using a composite layer and a two-step etching process in a salicide process in the fabrication of integrated circuits is achieved. Isolation areas are formed on a semiconductor substrate surrounding and electrically isolating device areas wherein at least one device area is to be silicided and wherein at least one device area is not to be silicided. A composite resist protective oxide layer is formed overlying device areas comprising a first layer of oxide and a second layer of silicon oxynitride. The silicon oxynitride layer is dry etched away overlying the device area to be silicided. Thereafter, the oxide layer is wet etched away overlying the device area to be silicided. Silicidation is performed to complete fabrication of the integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
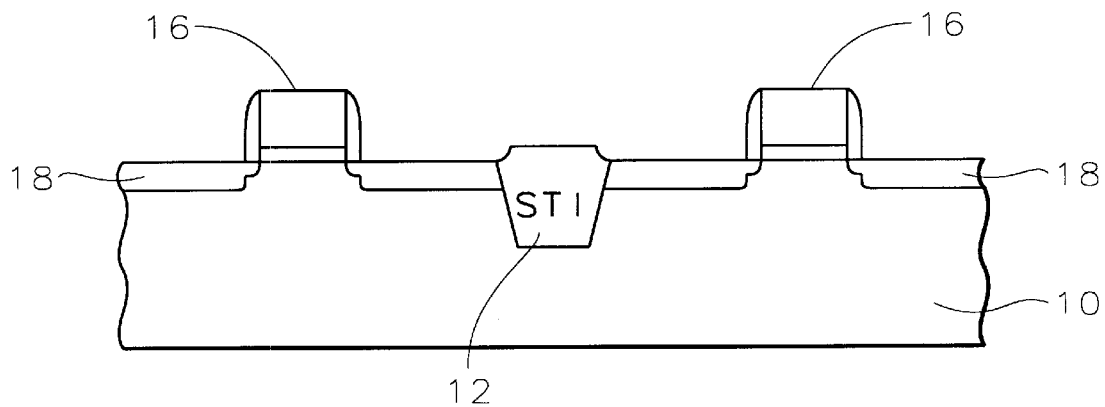
FIGS. 1 through 6: are cross-sectional representations of a preferred embodiment of the present invention.
Figure 2:
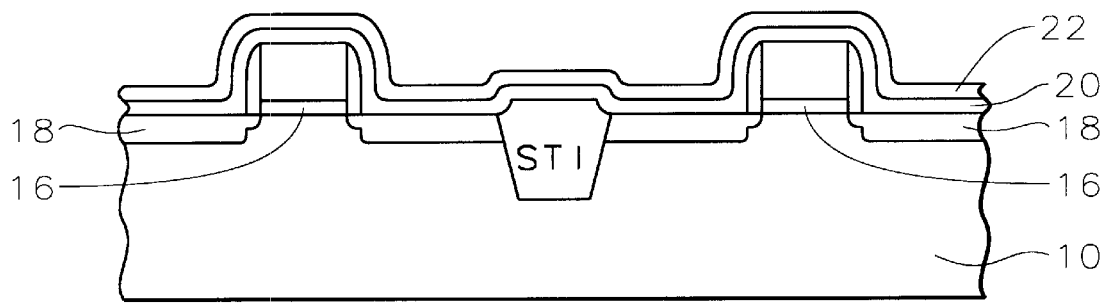

Referring now more particularly to FIG. 1, there is shown a semiconductor substrate 10, preferably composed of monocrystalline silicon. Isolation regions are formed in and on the semiconductor substrate to separate active areas from one another. For example, local oxidation of silicon (LOCOS) or shallow trench isolation (STI) may be used. In the example illustrated, STI region 12 is formed in the semiconductor substrate. For example, the area to the right of the STI region 12 is to be silicided while the area to the left of the STI region 12 is to be protected from silicidation by the RPO layer of the present invention. For example, the area to be silicide d could include logic devices while memory devices are not to be silicided. For example, this may be a cobalt silicide process.

It will be understood by those skilled in the art that the invention should not be limited to the application illustrated in the drawings, but can be applied and extended to any application in which it is desired to improve the quality of the protection layer used to protect an area from any kind of silicidation. As shown in FIG. 1, semiconductor device structures, such as gate electrodes 16 and source and drain regions 18 are formed in and on the semiconductor substrate. Spacers 17 have been formed on the sidewalls of the gate electrodes. Typically the spacers 17 may be silicon nitride or a composite silicon nitride and tetraethoxysilane (TEOS) oxide. An oxide spacer liner layer, not shown, is typically deposited underlying the spacer to relieve stress.

Typically, a resiist protective oxide (RPO) layer comprises oxide having a thickness of about 350 Angstroms. Now, the novel composite resist protective oxide (RPO) layer of the present invention will be deposited over the semiconductor device structures. First a layer of oxide 20 is deposited, for example, by plasma enhanced chemical vapor deposition (PECVD) over the surface of the substrate to a thickness of between about 50 and 200 Angstroms. This oxide layer is to be made as thin as possible in order to reduce the possibility of spacer liner recessing. Now, a silicon oxynitride (SiON) layer 22 is deposited over the oxide layer 20 to a thickness of between about 100 and 500

Angstroms. Alternatively, the layer 22 could be silicon nitride. This composite layer has the required protective thickness, but a much thinner oxide component in order to reduce spacer liner and STI oxide loss during removal of the RPO layer.

Figure 3:
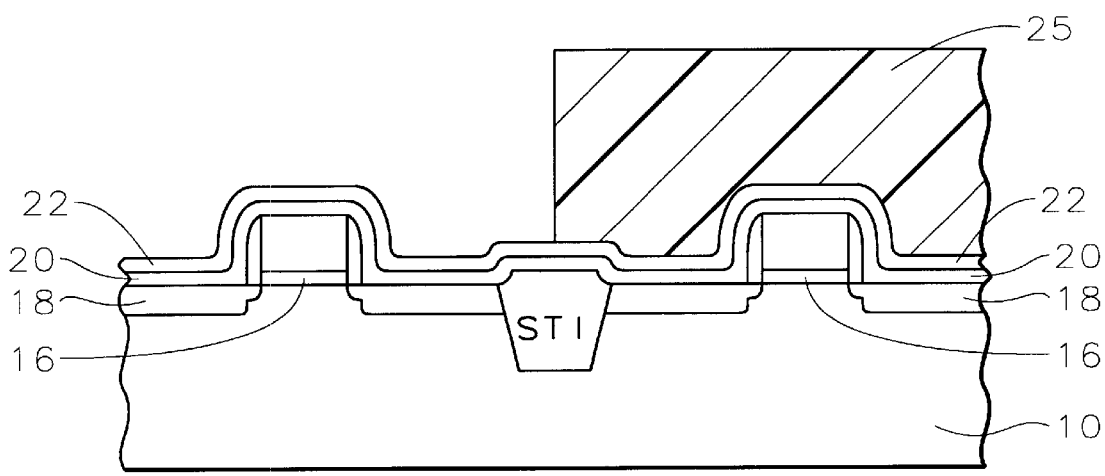

Referring now to FIG. 3, a photoresist mask 25 is formed over the portion of the wafer which is to be protected from silicidation. The RPO layer 22/20 is to be removed where silicidation is to be performed on the left side of the drawing figure.

Figure 4:
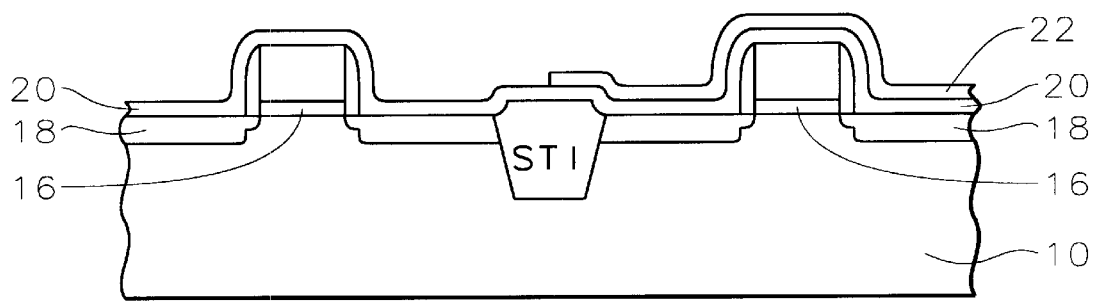

Referring now to FIG. 4, the silicon oxynitride layer 22 is removed where it is not covered by the mask 25. The layer 22 is removed by a dry etch process with an etch stop at the oxide layer 20. The dry etching process may be performed in a MERIE chamber, for example, using $CH_3F$ and $O_2$ gases. In order to provide high selectivity of SiON to oxide, it is preferred to use $CH_3F$ gas in the etching process. The oxide layer 20 prevents substrate loss and active area damage that occurs during dry etch removal of the RPO layer in the prior art. The photoresist mask 25 is stripped.

Figure 5:
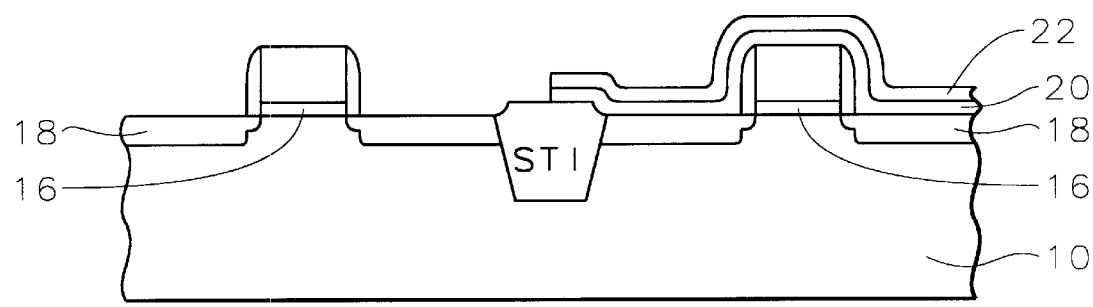

Referring now to FIG. 5, the oxide layer 20 not covered by the silicon oxynitride layer 22 is removed by a hydrofluoric (HF) acid dip. It is preferred that the HF dip have a concentration of 50:1 to 100:1 and a duration of about 70 seconds. Spacer liner recessing and STI oxide loss are caused by overetching of the wet dip. By reducing the oxide 20 thickness, the wet dip time and thus the overetch time are reduced. This results in a reduction of spacer liner recessing and STI oxide loss.

Figure 6:
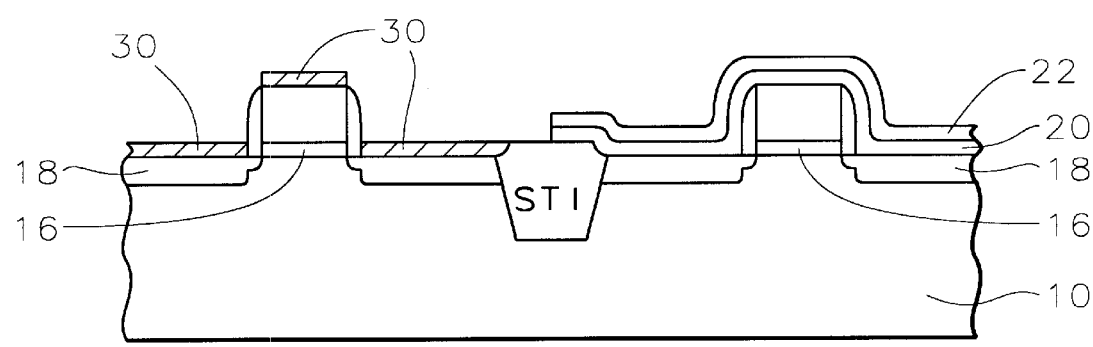

Now, salicidation is to be performed. For example, a cobalt layer is sputter deposited over the wafer surface and annealed. The cobalt layer overlying silicon surfaces is transformed to cobalt silicide. The unreacted cobalt over the spacers, STI 12, and the RPO 22/20 is removed, leaving silicided gate electrodes and source/drain regions. Silicided regions 30 are shown in FIG. 6.

Figure 7:
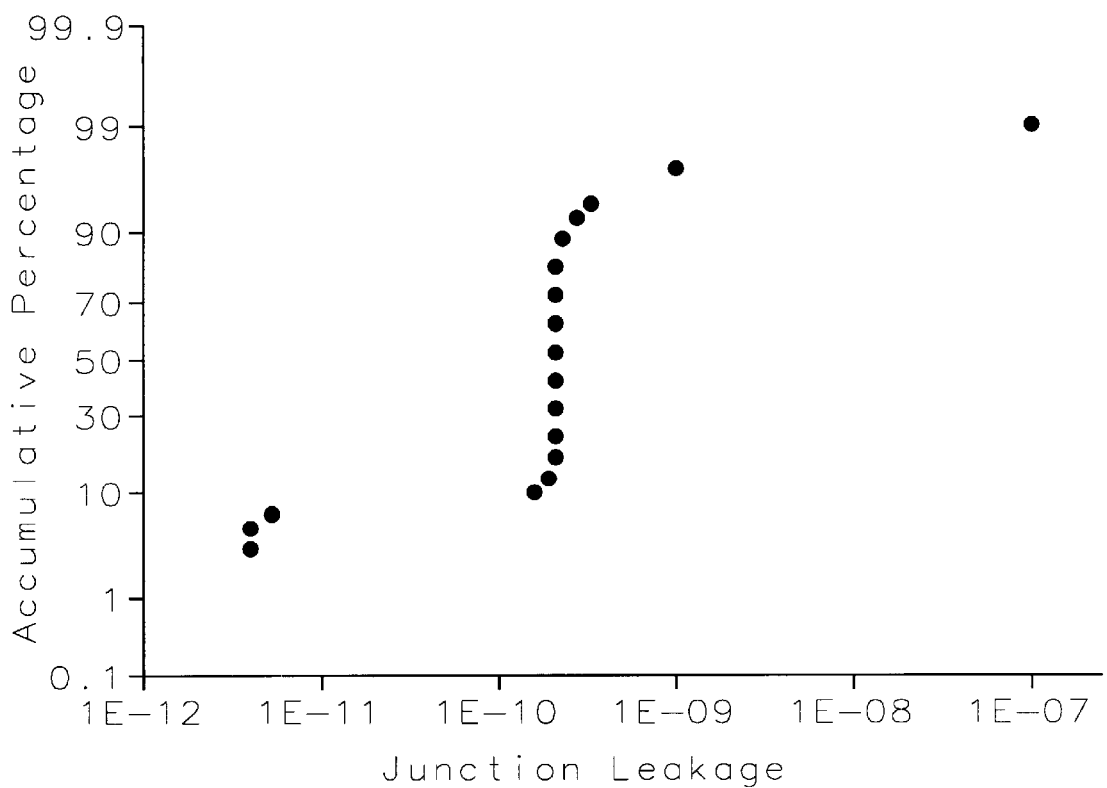
FIG. 7 is a graphical representation showing junction leakage tailing in a process of the prior art.
Figure 8:
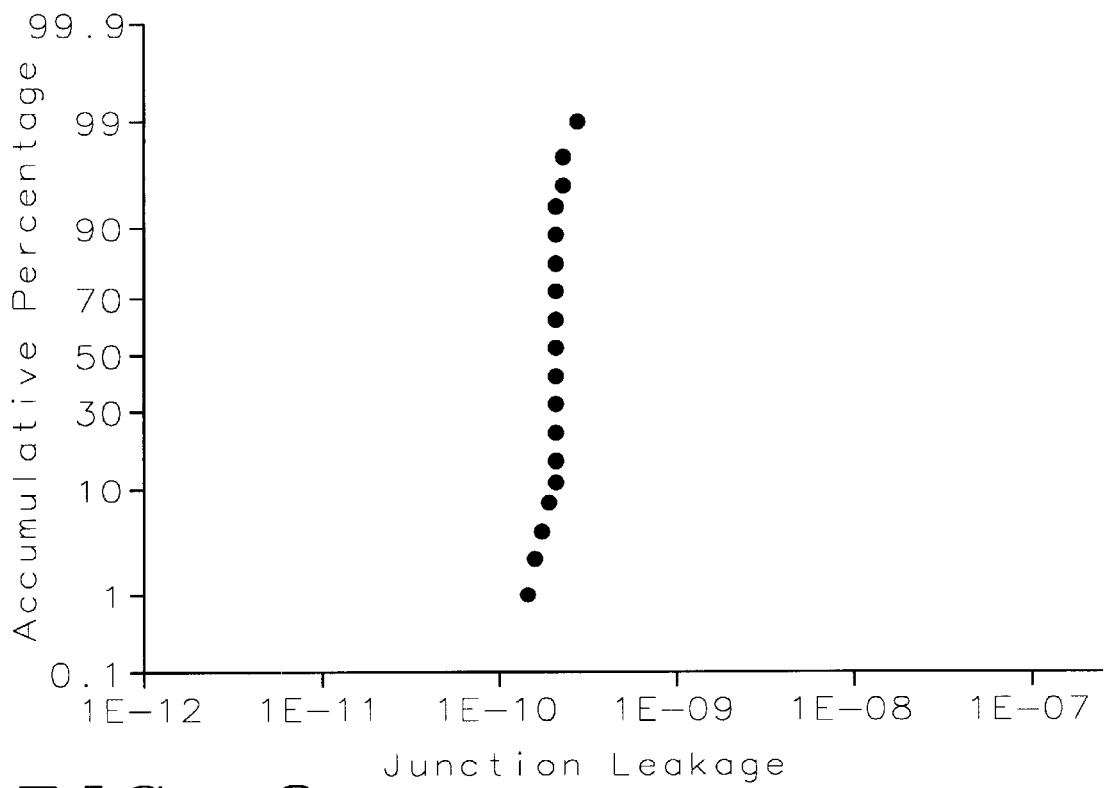
FIG. 8 is a graphical representation showing junction leakage tailing in the process of the present invention.

FIG. 7 illustrates the junction leakage tailing found in a prior art process using a standard RPO layer. FIG. 8 illustrates the junction leakage tailing found in the process of the present invention, based on experimental results. No tailing is found in the process of the present invention. It has been found that the process of the present invention has a lower junction leakage (about 30% reduction) and narrower distribution than the prior art process.

In the process of the prior art, where the RPO layer is fully oxide having a thickness of about 350 Angstroms, a long wet etch time is necessary to compensate for poor oxide uniformity and step coverage. This can result in oxide loss causing a void underlying the spacer. The process of the present invention reduces the oxide thickness by using the novel composite RPO layer disclosed hereinabove. THis effectively reduces wet etch time, thereby preventing recessing of the spacer liner oxide. The process of the present invention has been performed experimentally. It has been shown that while a void appears under the spacer in the conventional process, no void under the spacer appears in the process of the present invention.

The process of the present invention provides a method for forming a composite RPO layer and a two-step etching process for this layer that results in much improved junction leakage performance and eliminates voids under the spacers thereby improving the resulting silicided device.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:

forming isolation areas on a semiconductor substrate surrounding and electrically isolating device areas wherein at least one device area is to be silicided and wherein at least one device area is not to be silicided;

forming a composite resist protective oxide layer overlying said device areas;

first dry etching away a top portion of said composite resist protective oxide layer overlying said device area to be silicided;

thereafter second wet etching away a remainder of said composite resist protective oxide layer overlying said device area to be silicided; and thereafter siliciding said device area to be silicided to complete fabrication of said integrated circuit device.

2. The method according to claim 1 wherein said isolation areas comprise shallow trench isolation.

3. The method according to claim 1 further comprising forming semiconductor device structures in and on said semiconductor substrate wherein said semiconductor device structures include gate electrodes and associated source and drain regions wherein said composite resist protective oxide layer overlies said semiconductor device structures.

4. The method according to claim 1 wherein said step of forming said composite resist protective oxide layer comprises:

depositing a layer a silicon oxide overlying said device areas; and depositing a layer of silicon oxynitride overlying said silicon oxide layer.

5. The method according to claim 4 wherein said silicon oxide layer is deposited by plasma-enhanced chemical vapor deposition to a thickness of between about 50 and 200 Angstroms.

6. The method according to claim 4 wherein said silicon oxynitride layer has a thickness of between about 100 and 500 Angstroms.

7. The method according to claim 4 wherein said step of first etching away a top portion of said composite resist protective oxide layer comprises dry etching said silicon oxynitride layer using $CH_3F$ gas with an etch stop at said silicon oxide layer and wherein said step of second etching away said remainder of said composite resist protective oxide layer comprises dipping in a hydrofluoric acid solution to remove said silicon oxide layer.

8. The method according to claim 1 wherein said step of first etching away a top portion of said composite resist protective oxide layer comprises dry etching using $CH_3F$ gas.

9. The method according to claim 1 wherein said step of second etching away said remainder of said composite resist protective oxide layer comprises dipping in a hydrofluoric acid solution.

10. The method according to claim 1 wherein said step of siliciding said device area to be silicided comprises forming a cobalt silicide layer where said device areas are not covered by said resist protective oxide layer.

11. A method of fabricating an integrated circuit device comprising:

forming isolation areas on a semiconductor substrate surrounding and electrically isolating device areas wherein at least one device area is to be silicided and wherein at least one device area is not to be silicided;

forming semiconductor device structures in said device areas in and on said semiconductor substrate wherein said semiconductor device structures include gate electrodes and associated source and drain regions;

forming a composite resist protective oxide layer overlying said semiconductor device structures;

first dry etching away a top portion of said composite resist protective oxide layer overlying said device area to be silicided;

thereafter second wet etching away a remainder of said composite resist protective oxide layer overlying said device area to be silicided; and thereafter siliciding said device area to be silicided to complete fabrication of said integrated circuit device.

12. The method according to claim 11 wherein said isolation areas comprise shallow trench isolation.

13. The method according to claim 11 wherein said step of forming said composite resist protective oxide layer comprises:

depositing a layer a silicon oxide overlying said device areas; and depositing a layer of silicon oxynitride overlying said silicon oxide layer.

14. The method according to claim 13 wherein said silicon oxide layer is deposited by plasma-enhanced chemical vapor deposition to a thickness of between about 50 and 200 Angstroms.

15. The method according to claim 13 wherein said silicon oxynitride layer has a thickness of between about 100 and 500 Angstroms.

16. The method according to claim 11 wherein said step of first etching away a top portion of said composite resist protective oxide layer comprises dry etching using $CH_3F$ gas.

17. The method according to claim 11 wherein said step of second etching away said remainder of said composite resist protective oxide layer comprises dipping in a hydrofluoric acid solution.

18. The method according to claim 13 wherein said step of first etching away a top portion of said composite resist protective oxide layer comprises dry etching said silicon oxynitride layer using $CH_3F$ gas with an etch stop at said silicon oxide layer and wherein said step of second etching away said remainder of said composite resist protective oxide layer comprises dipping in a hydrofluoric acid solution to remove said silicon oxide layer.

19. The method according to claim 11 wherein said step of siliciding said device area to be silicided comprises forming a cobalt silicide layer where said device areas are not covered by said resist protective oxide layer.

20. A method of fabricating an integrated circuit device comprising:

forming isolation areas on a semiconductor substrate surrounding and electrically isolating device areas wherein at least one device area is to be silicided and wherein at least one device area is not to be silicided;

forming semiconductor device structures in said device areas in and on said semiconductor substrate wherein said semiconductor device structures include gate electrodes and associated source and drain regions;

forming a composite resist protective oxide layer overlying said semiconductor device structures comprising:

depositing a layer a silicon oxide by plasma enhanced chemical vapor deposition overlying said device areas; and depositing a layer of silicon oxynitride overlying said silicon oxide layer to form said composite resist protective oxide layer;

dry etching away using $CH_3F$ gas said silicon oxynitride layer overlying said device area to be silicided etching with an etch stop at said silicon oxide layer;

thereafter dipping in a hydrofluoric acid solution to etch away said silicon oxide layer overlying said device area to be silicided; and thereafter siliciding said device area to be silicided to complete fabrication of said integrated circuit device.

21. The method according to claim 20 wherein said silicon oxide layer has a thickness of between about 50 and 200 Angstroms.

22. The method according to claim 20 wherein said silicon oxynitride layer has a thickness of between about 100 and 500 Angstroms.

23. The method according to claim 20 wherein said step of siliciding said device area to be silicided comprises forming a cobalt silicide layer where said device areas are not covered by said resist protective oxide layer.

* * * * *